(12) United States Patent
Noguchi et al.

(10) Patent No.: US 10,897,820 B2
(45) Date of Patent: Jan. 19, 2021

(54) PRINTED WIRING BOARD, PRINTED CIRCUIT BOARD, AND ELECTRONIC DEVICE

(71) Applicant: CANON KABUSHIKI KAISHA, Tokyo (JP)

(72) Inventors: Koji Noguchi, Yokohama (JP); Yusuke Hashimoto, Tachikawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/749,179

(22) Filed: Jan. 22, 2020

(65) Prior Publication Data

US 2020/0163213 A1 May 21, 2020

Related U.S. Application Data

(63) Continuation of application No. 15/672,065, filed on Aug. 8, 2017, now Pat. No. 10,582,615.

(30) Foreign Application Priority Data

Sep. 1, 2016 (JP) .................................. 2016-170958

(51) Int. Cl.
*H05K 1/11* (2006.01)
*H05K 3/34* (2006.01)
*H01L 23/498* (2006.01)
*H05K 1/18* (2006.01)
(Continued)

(52) U.S. Cl.
CPC ........ *H05K 1/111* (2013.01); *H01L 23/49838* (2013.01); *H01L 23/562* (2013.01); *H01L 24/16* (2013.01); *H05K 1/0271* (2013.01); *H05K 1/181* (2013.01); *H05K 3/3436* (2013.01); *H05K 3/3452* (2013.01); *H01L 23/49811* (2013.01); *H01L 23/49816* (2013.01); *H01L 2224/16105* (2013.01); *H01L 2224/16227* (2013.01); *H01L 2224/16237* (2013.01); *H01L 2924/1511* (2013.01); *H01L 2924/3511* (2013.01); *H05K 2201/099* (2013.01); *H05K 2201/0989* (2013.01); *H05K 2201/09136* (2013.01); *H05K 2201/09227* (2013.01);
(Continued)

(58) Field of Classification Search
CPC .... H05K 1/111; H05K 1/0271; H05K 3/3436; H05K 3/3452; H01L 23/49838
See application file for complete search history.

(56) References Cited

U.S. PATENT DOCUMENTS 6,133,134 A 10/2000 Mehr
6,228,466 B1 5/2001 Tsukada
(Continued)

FOREIGN PATENT DOCUMENTS

JP H10-214911 8/1998
JP 2001-230513 8/2001

*Primary Examiner* — Nathan Milakovich
(74) *Attorney, Agent, or Firm* — Venable LLP

(57) ABSTRACT

Provided is a printed wiring board comprising: a substrate; a conductive layer including a land and a wiring and formed on a surface of the substrate, the wiring having a width smaller than the land and drawn from the land; and an insulating layer formed on the conductive layer. The insulating layer has an opening corresponding to a position of the land, and an edge of the opening runs above the land and above one of edges in a width direction of the wiring.

20 Claims, 9 Drawing Sheets

(51) Int. Cl.
   *H01L 23/00*   (2006.01)
   *H05K 1/02*   (2006.01)
(52) U.S. Cl.
   CPC .............. *H05K 2201/09409* (2013.01); *H05K 2201/10719* (2013.01); *H05K 2201/10734* (2013.01); *Y02P 70/50* (2015.11)

(56) References Cited

U.S. PATENT DOCUMENTS

| | | | |
|---|---|---|---|
| 6,441,316 B1* | 8/2002 | Kusui | .................. H05K 3/3452 |
| | | | 174/260 |
| 6,443,351 B1 | 9/2002 | Huang | |
| 6,849,805 B2 | 2/2005 | Honda | |
| 6,998,715 B1 | 2/2006 | Fuji | |
| 7,064,435 B2* | 6/2006 | Chung | ................. H05K 3/3452 |
| | | | 257/738 |
| 7,135,204 B2 | 11/2006 | Karasawa | |
| 7,180,005 B2 | 2/2007 | Urano | |
| 7,429,799 B1 | 9/2008 | Yoshida | |
| 7,906,835 B2 | 3/2011 | Romero | |
| 8,243,462 B2* | 8/2012 | Shibuya | ............... H05K 1/0271 |
| | | | 361/760 |
| 8,466,565 B2 | 6/2013 | Takeda | |
| 9,111,818 B2* | 8/2015 | Lin | ..................... H01L 21/4853 |
| 9,814,135 B2 | 11/2017 | Nakamura | |
| 2002/0071935 A1 | 6/2002 | Wu | |
| 2005/0127487 A1* | 6/2005 | Chang | ..................... H01L 24/02 |
| | | | 257/678 |
| 2008/0093749 A1 | 4/2008 | Gerber | |
| 2010/0164101 A1* | 7/2010 | Lee | ..................... H05K 3/3452 |
| | | | 257/738 |

* cited by examiner

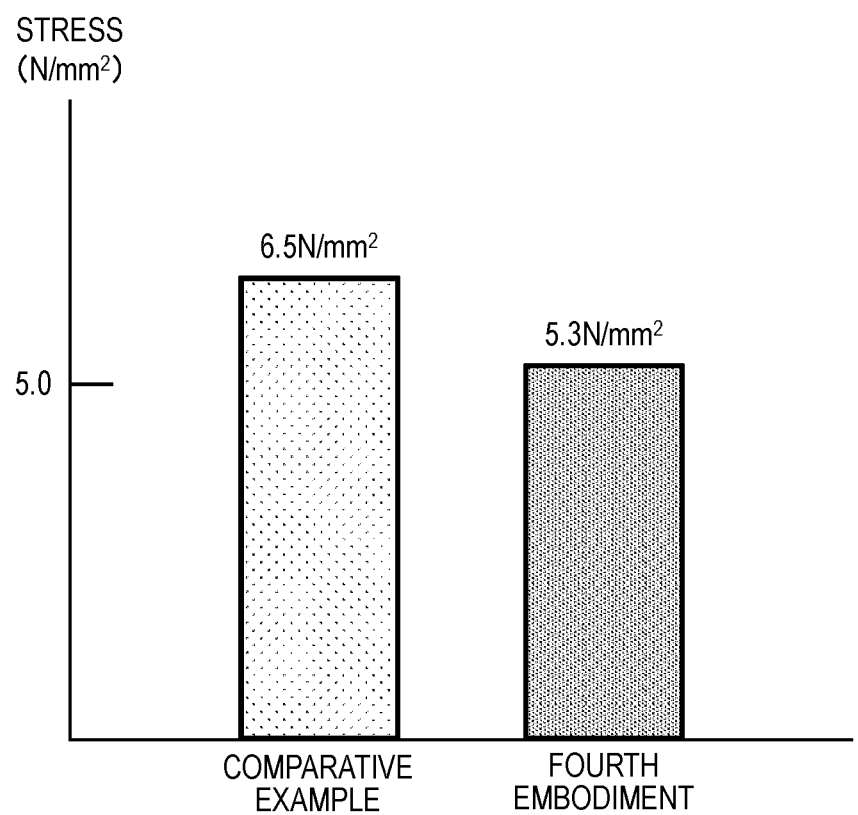

PRINTED WIRING BOARD, PRINTED CIRCUIT BOARD, AND ELECTRONIC DEVICE

This application is a continuation of U.S. application Ser. No. 15/672,065, filed on Aug. 8, 2017.

BACKGROUND OF THE INVENTION

Field of the Invention

The present invention relates to a printed wiring board, a printed circuit board, and an electronic device.

Description of the Related Art

Reduction in size and high functionality of electronic devices have led to reduction in size of a printed circuit board built in the electronic devices. In order to realize reduction in size of a printed circuit board, thinner wirings are employed in a printed wiring board of the printed circuit board, and the size of an electronic component such as a semiconductor device mounted thereon has been reduced. Further, a packaging density of electronic components has increased.

Therefore, in recent years, a ball grid array (hereafter, referred to as BGA) package, a land grid array (hereafter, referred to as LGA) package, or the like is used as a package of a high functionality semiconductor device.

The BGA package and the LGA package have the structure in which lands provided on a printed wiring board and lands provided on the undersurface of a package are joined by solder therebetween. When a semiconductor device operates, since a package is subjected to thermal deformation due to heat generation, a stress occurs at a junction between the package and the printed wiring board. Further, a stress due to deformation may occur not only at the junction but also at peripheral members such as a land provided on the undersurface of the package, solder, a land on the printed wiring board, and a wiring connected to a land. In order to suppress a break of members around a junction due to a stress caused by thermal deformation or the like occurring in such a way, various technologies have been proposed.

Japanese Patent Application Laid-open No. 2001-230513 discloses structure in which a gap is provided between an edge of a land of a printed wiring board and an edge of an opening of a solder resist film and thereby solder flows around into a side surface of the land when joining by soldering. This structure may improve the joining strength against warping and bending.

Japanese Patent Application Laid-open No. H10-214911 discloses structure in which the peel strength of a land is improved by covering both edges in the longer axis direction of the land with an insulating film.

In recent years, due to a demand for further reduction in size and high functionality of electronic devices, such structure may be employed that thinner wirings are drawn from lands of a printed wiring board.

Thus, improvement of the strength against a stress caused by thermal deformation may be demanded also for a wiring drawn from a land.

SUMMARY OF THE INVENTION

The present invention intends to provide a printed wiring board and a printed circuit board with an improved reliability by improving the strength of a wiring against a stress.

A printed wiring board according to at least one embodiment of the present invention includes a substrate; a conductive layer including a land and a wiring and formed on a surface of the substrate, the wiring having a width smaller than the land and drawn from the land; and an insulating layer formed on the conductive layer. The insulating layer has an opening corresponding to a position of the land, and an edge of the opening runs above the land and above one of edges in a width direction of the wiring.

Further features of the present invention will become apparent from the following description of exemplary embodiments with reference to the attached drawings.

BRIEF DESCRIPTION OF THE DRAWINGS

FIG. 7 is a graph illustrating a simulation result of a stress.

DESCRIPTION OF THE EMBODIMENTS

Figure 1A:
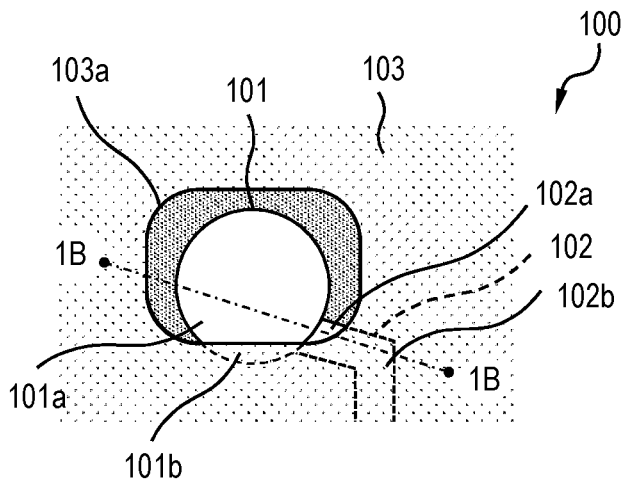
FIG. 1A, FIG. 1B, and FIG. 1C are diagrams of the structure of a printed wiring board and a printed circuit board according to a first embodiment.

Preferred embodiments of the present invention will now be described in detail in accordance with the accompanying drawings.

First Embodiment

A printed wiring board and a printed circuit board according to the first embodiment of the present invention will be described with reference to FIG. 1A, FIG. 1B, and FIG. 1C. The same reference numerals are provided to members or portions corresponding to each other among drawings, and the description of duplicate members or portions may be simplified or omitted in the following description.

FIG. 1A is a plan view of a printed wiring board 100 used in a printed circuit board according to the first embodiment and depicts a state before an electronic component is mounted. A land 101 and a wiring 102 are formed as a conductive layer on the surface of the printed wiring board 100, and an insulating layer 103 is formed thereon. The land 101 is a region that is connected mainly to solder when an electronic component is mounted thereon and shaped in a circle. Note that the shape of the land 101 may be other shapes than a circle and may be an ellipse, an oval, a rectangle, a square, or the like, for example. Further, for improvement of a workability, prevention of concentration of a stress, or the like, the corner of the rectangle or the square may be shaped round. The wiring 102 having a smaller width than the land 101 is drawn from the land 101 and electrically connects a terminal of an electronic component to another circuit. The insulating layer 103 is opened so as to expose a part of the land 101 and the wiring 102, and the edge of the opening is depicted as an opening edge 103a. The insulating layer 103 has a function as a solder resist that defines a range where solder can be connected to the conductive layer by preventing solder from attaching to an unnecessary portion when an electronic component is mounted on the printed wiring board 100. Note that a semiconductor device such as a semiconductor integrated circuit may be exemplified as an electronic component which may be used in the present embodiment.

Further, in FIG. 1A, a region of the land 101 in which the insulating layer 103 is opened is depicted as an opened region 101a, and a region which is covered with the insulating layer is depicted as a covered region 101b. Further, a region of the wiring 102 in which the insulating layer 103 is opened is depicted as an opened region 102a, and a region which is covered with the insulating layer is depicted as a covered region 102b. As illustrated in FIG. 1A, in a top view, the wiring 102 is drawn from a position including the opening edge 103a that is a boundary between the covered region 101b where the insulating layer 103 covers the land 101 and the opened region 101a where the insulating layer 103 does not cover the land 101.

Figure 1B:
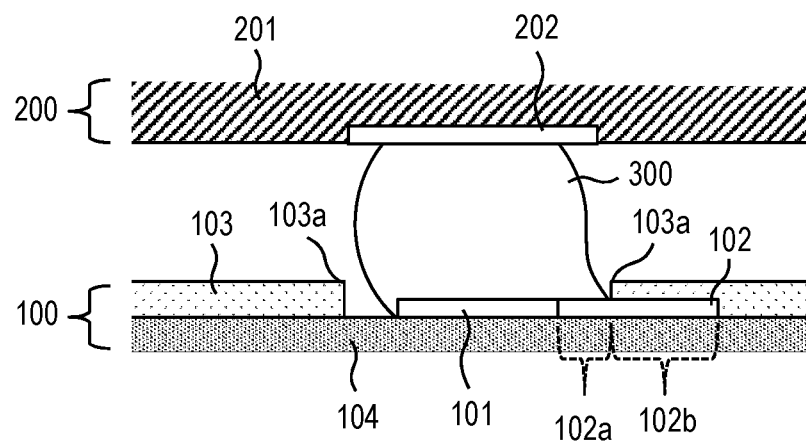

FIG. 1B is a sectional view taken along a line 1B-1B of the printed circuit board according to the first embodiment. Unlike FIG. 1A, FIG. 1B illustrates a cross section in a state where an electronic component 200 is mounted on the printed wiring board 100. The land 101 formed on a substrate 104 of the printed wiring board 100 is connected to a land 202 formed by solder 300 on the undersurface of a package 201 of the electronic component 200. As illustrated in FIG. 1B, the solder 300 is connected not only to the opened region 101a of the land 101 but also to the opened region 102a of the wiring 102.

The substrate 104 is a plate-like member whose primary material is an insulating material such as a glass epoxy. In FIG. 1B, while the substrate 104 is depicted as a conductive layer being formed on the surface, it may be a multilayer substrate in which a conductive layer is formed in the inner layer. The package 201 of the electronic component 200 is a BGA package. The solder 300 is a solder ball that has been formed in advance on the package 201 before mounting. However, the package structure of the electronic component 200 may be an LGA. In this case, since mounting is performed by a method of forming solder on the printed wiring board 100 by using a technique such as screen printing, for example, the sectional structure after mounting will be the same as that of FIG. 1B. Note that, in order to improve the strength of a junction, an under-fill material may be filled between the printed wiring board 100 and the electronic component 200.

Figure 1C:
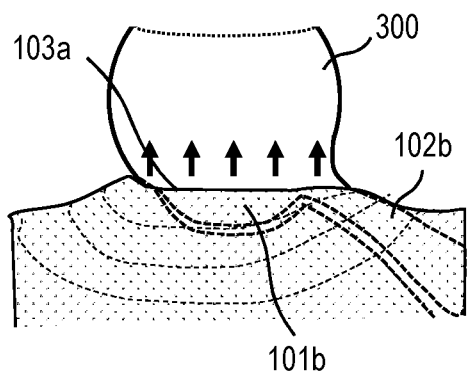

FIG. 1C is a perspective view schematically illustrating deformation of the printed circuit board occurring during heat generation of the electronic component 200. In the package 201 of the electronic component 200, a rise in the temperature due to heat generation causes warping and therefore a portion of an increased distance to the printed wiring board 100 occurs. This warping causes the land 101 in the opened region 101a and the wiring 102 in the opened region 102a connected to the solder 300 to be subjected to an upward stress (the direction of arrows in FIG. 1C). On the other hand, the land 101 in the covered region 101b and the wiring 102 in the covered region 102b are not connected to the solder 300 and thus are subjected to a downward stress against the above-described upward stress from the substrate 104 or the like. Thus, the opening edge 103a of the insulating layer 103 becomes a boundary of the two stresses having different directions described above. Thereby, the land 101 and the wiring 102 are deformed along the opening edge 103a.

Comparative Example

In order to further clarify the advantages of the embodiment of the present invention, a printed wiring board and a printed circuit board according to a comparative example which is to be compared to the present embodiment will be described here by using FIG. 9A, FIG. 9B, FIG. 10A, and FIG. 10B.

Figure 9A:
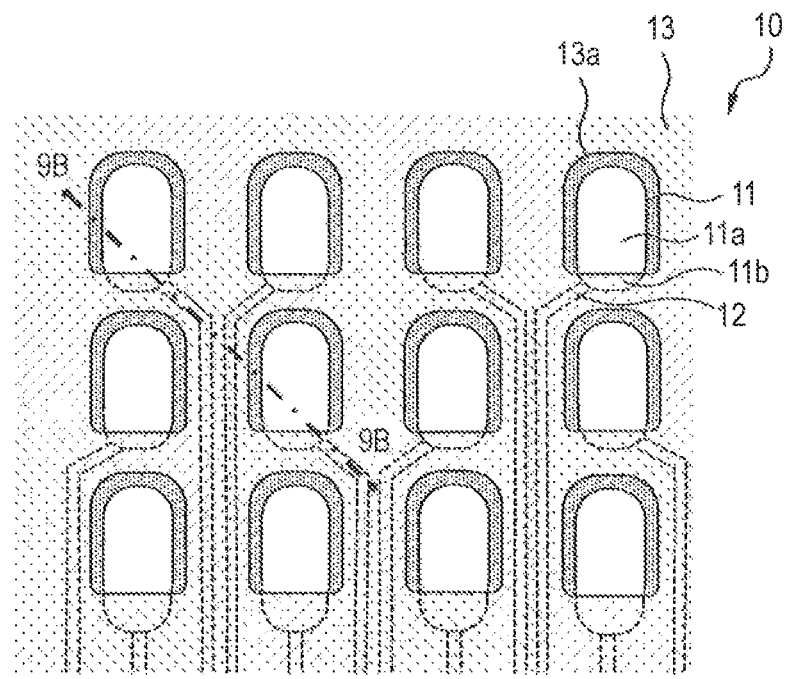
FIG. 9A and FIG. 9B are diagrams of the structure of a printed wiring board and a printed circuit board according a comparative example.

FIG. 9A is a plan view of a printed wiring board used in the printed circuit board according to the comparative example and depicts a state before an electronic component is mounted. A conductive layer is formed on the surface of the printed wiring board 10 and divided into lands 11 and wirings 12. An insulating layer 13 is formed on the conductive layer. Each land 11 is an oval region to be connected to solder when an electronic component is mounted thereon. Each wiring 12 is drawn from the land 11 and electrically connects a terminal of an electronic component to another circuit. The insulating layer 13 is opened so as to expose a part of the land 11, and an edge of the opening is depicted as an opening edge 13a. Further, FIG. 9A depicts that, in the land 11, a region in which the insulating layer 13 is opened is an opened region 11a, and a region which is covered with the insulating layer is a covered region 11b.

Figure 9B:
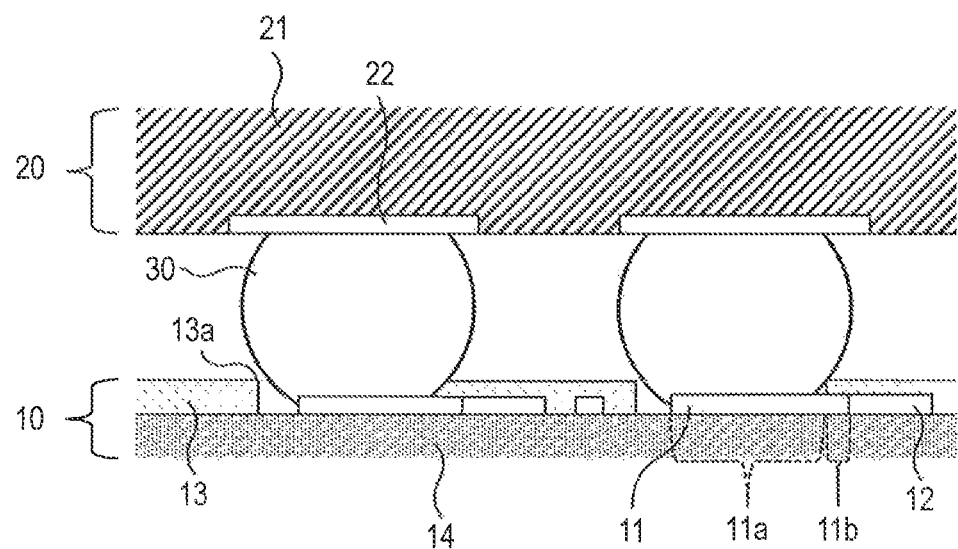

FIG. 9B is a sectional view taken along a line 9B-9B of the printed circuit board according to the comparative example. Unlike FIG. 9A, FIG. 9B illustrates a cross section with an electronic component 20 being mounted on the printed wiring board 10. The land 11 formed on a substrate 14 of the printed wiring board 10 is connected to a land 22 formed by solder 30 on the undersurface of a package 21 of the electronic component 20. The package 21 of the electronic component 20 is a BGA package, and the solder 30 is a solder ball that has been provided in advance on the package 21 before mounting.

Figure 10A:
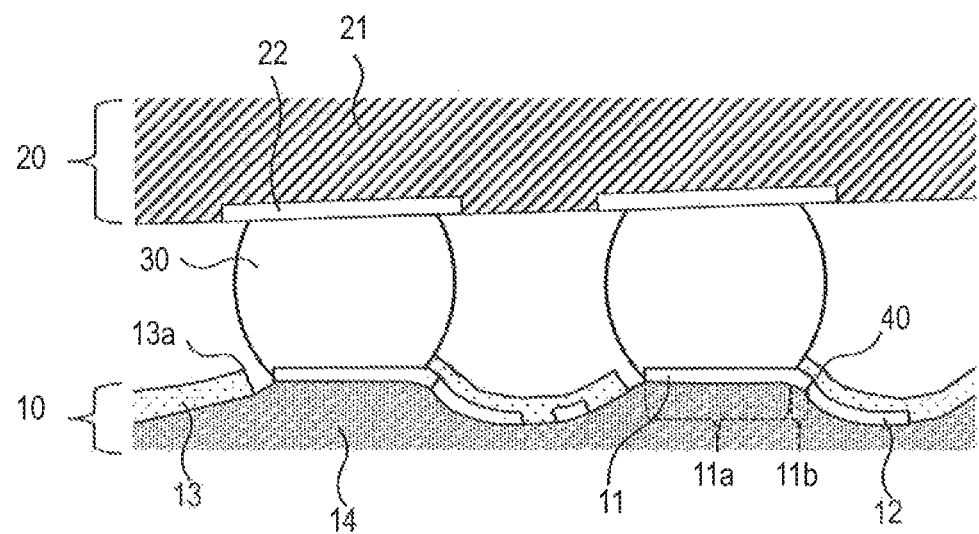
FIG. 10A and FIG. 10B are diagrams schematically illustrating deformation of a printed circuit board according to the comparative example.

FIG. 10A is a sectional view schematically illustrating deformation of the printed circuit board occurring during heat generation of the electronic component 20. The package 21 of the electronic component 20 warps when the temperature thereof rises due to heat generation. This warping causes the land 11 of the opened region 11a connected to the solder 30 to be subjected to an upward stress in FIG. 10A, and the member around the opened region 11a is deformed as pulled upward.

Figure 10B:
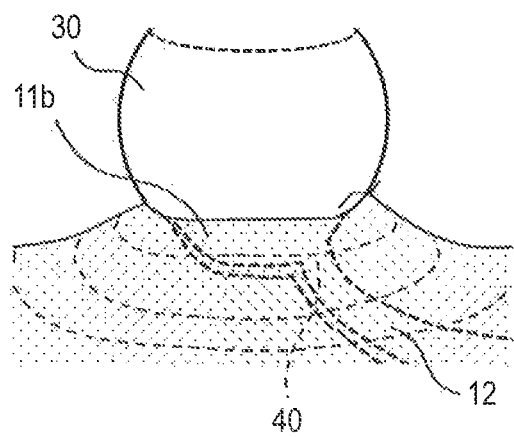

FIG. 10B is a perspective view schematically illustrating such deformation. Because of a narrower gap between terminals due to densification of mounting, the lands 11 are closer to each other. Thus, it can be seen that the wiring 12 is drawn from a position close to the opened region 11a that is highly deformed and the wiring 12 is deformed significantly as illustrated in FIG. 10B. In this comparative example, the printed wiring board 10 has the structure in which a stress is likely to concentrate at a drawing position where the shape changes from the land 11 to the wiring 12 whose width is smaller. Thus, the inventors found that, in the structure of this comparative example, occurrence of deformation of the printed circuit board due to heat generation of the electronic component 20 is likely to cause a break in the width direction of the wiring 12 at the drawing position between the land 11 and the wiring 12. In FIG. 10A and FIG. 10B, the portion where a break is likely to occur is depicted as a break occurrence portion 40.

When the area of the land 11 is designed to be smaller in order to support reduction in size or the like of an electronic device, the stress applied to the land 11 increases. Further, a narrower gap between terminals of the package 21 for reduction in size or high functionality causes the lands 11 to be closer to each other, which requires the wiring 12 to be drawn from a position close to the opened region 11a and may cause the wiring 12 to be subjected to a larger stress. Therefore, the above-described problem of a break of the wiring 12 can be more significant due to a demand for reduction in size and high functionality of an electronic device.

In contrast, in the structure of the first embodiment, unlike the comparative example, deformation may occur in a direction along the opening edge 103a rather than in a direction across the wiring in the width direction thereof, and therefore occurrence of a break in the width direction of the wiring can be reduced. While a stress along the opening edge 103a may occur, the stress is dispersed over a long continuous region ranging from the wiring 102 to the land 101 and thus the influence of the stress can be reduced. Further, since the solder 300 is connected so as to be bridged between the land 101 and the wiring 102, the above-described stress is less likely to concentrate at the corner of the boundary between the land 101 and the wiring 102.

For the reasons above, in the present embodiment, the strength of the wiring against a stress is improved compared to the comparative example. Thereby, occurrence of a break can be reduced, and a printed wiring board and a printed circuit board with an improved reliability can be provided.

Second Embodiment

Figure 2:
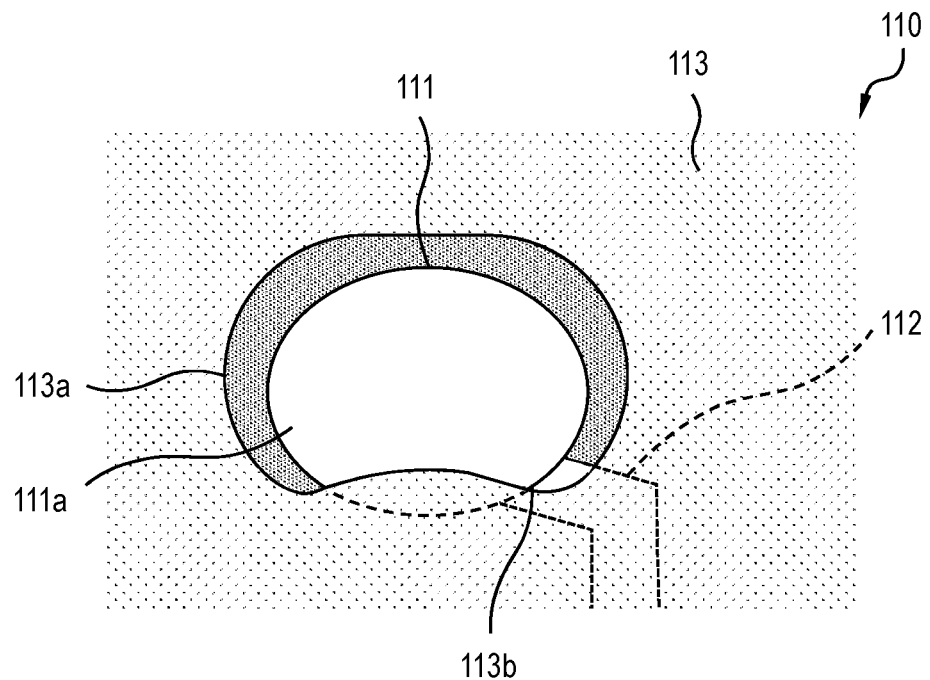
FIG. 2 is a plan view of a printed wiring board according to a second embodiment.

A printed wiring board and a printed circuit board according to the second embodiment of the present invention will be described with reference to FIG. 2. FIG. 2 is a plan view of a printed wiring board 110 according to the second embodiment of the present invention and is a view corresponding to FIG. 1A in the first embodiment. The printed wiring board 110 of the present embodiment is different from that of the first embodiment in the shape of a land 111 and the shape of an insulating layer 113. The description will be simplified or omitted for other components that are the same as those in the first embodiment.

In the present embodiment, the shape of the opening edge 113a of the insulating layer 113 has an inward recess in a top view as illustrated in FIG. 2. Thus, around an intersecting point 113b of the opening edge 113a and a boundary line between the land 111 and a wiring 112, the opening edge 113a is shaped along a direction in which the wiring 112 is drawn. In other words, the angle of the normal direction of the opening edge 113a running inward the opening region 111a at the intersecting point 113b relative to the direction in which the wring 112 is drawn is approximately orthogonal. Thereby, even when deformation occurs along the opening edge 113a and a crack then occurs, the crack is less likely to run in the direction across the wiring 112 and occurrence of a break may decrease. Further, when the angle of the normal line of the opening edge 113a running inward the opened region 111a at the intersecting point 113b relative to the direction in which the wiring 112 is drawn is an acute angle, the advantage of reduction of occurrence of a break can be obtained for the same reasons. Note that the boundary between the land 111 and the wiring 112 refers to a line that extrapolates, in a portion from which a wiring is drawn, the perimeter of the land 111 in a portion from which the wiring is not drawn. Further, the direction in which the wiring 112 is drawn refers to a direction away from the land 111 on the center line of the wiring 112. When the wiring 112 is curved, the direction in which the wiring 112 is drawn refers to a direction away from the land 111 on a tangent to the center line of the wiring 112 at the intersection of the center line of the wiring 112 and the boundary between the wiring 112 and the land 111.

Further, the shape of the land 111 is not a circle but an ellipse in the present embodiment, though it is not a requirement. This is because the length of the opening edge 113a on the land 111 can be longer and occurrence of a break of the land 111 can be reduced even when a crack along the opening edge 113a reaches the land 111. Note that the same advantage can be obtained as long as the shape of the land 111 is longer in the lateral direction such as an oval, a rectangle, or the like.

Third Embodiment

Figure 3:
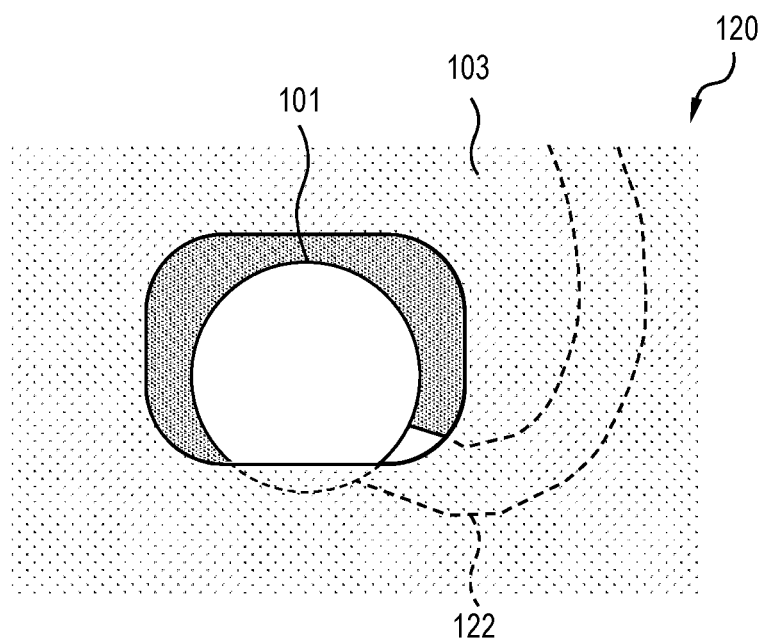
FIG. 3 is a plan view of a printed wiring board according to a third embodiment.

A printed wiring board and a printed circuit board according to the third embodiment of the present invention will be described with reference to FIG. 3. FIG. 3 is a plan view of a printed wiring board 120 according to the third embodiment of the present invention and is a view corresponding to FIG. 1A in the first embodiment. The printed wiring board 120 of the present embodiment is different from that of the first embodiment in the shape of a wiring 122. The description will be simplified or omitted for other components that are the same as those in the first embodiment.

In the present embodiment, the wiring 122 is shaped to be drawn from the land 101 and then separated in a spiral manner from the land 101. The amount of deformation of the printed wiring board 120 due to a rise in the temperature is larger in the area closer to the land 101. In the present embodiment, due to the spiral shape of the wiring 122, the distance between the wiring 122 and the land 101 gradually increases from the boundary thereof, which allows for a gradual deformation of the wiring 122 due to the rise in the temperature and results in less influence of the stress due to deformation of the printed wiring board 120. Therefore, a break of the wiring 122 is less likely to occur.

Fourth Embodiment

Figure 4:
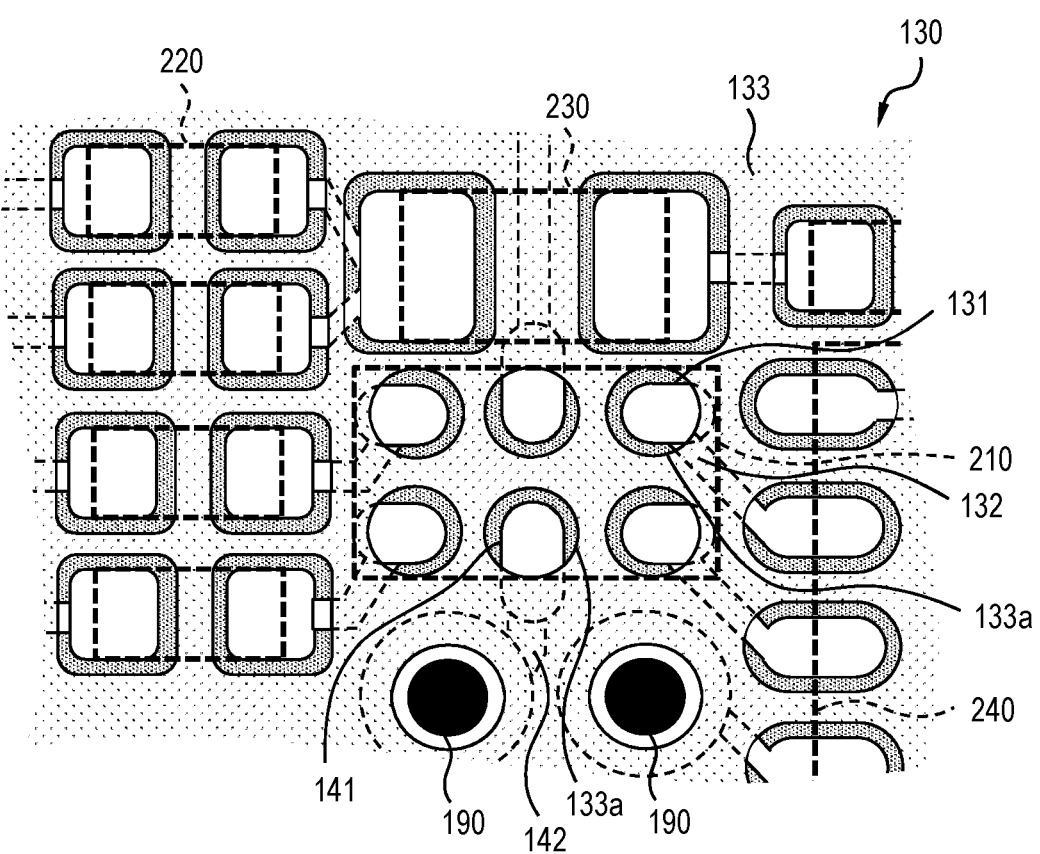
FIG. 4 is a plan view of a printed wiring board according to a fourth embodiment.

A printed wiring board and a printed circuit board according to the fourth embodiment of the present invention will be described with reference to FIG. 4. FIG. 4 is a plan view of a printed wiring board 130 according to the fourth embodiment. In the present embodiment, a more specific configuration of the printed wiring board 130 and the printed circuit board to which the present invention may be applied will be described. Note that, while the specific dimension, the specific pattern arrangement, and the specific device function may be illustrated in the present embodiment and the fifth embodiment described later, they are not limited to those described and may be changed if necessary in accordance with the design of the printed circuit board.

The printed wiring board 130 according to the present embodiment is configured such that multiple types of electronic components 210, 220, 230, and 240 can be mounted thereon. The frames with dashed lines in FIG. 4 illustrate the external shapes of the electronic components 210, 220, 230, and 240 that may be mounted. Further, via holes 190 each for electrically connecting a surface wiring to a wiring in another layer are provided in the printed wiring board 130.

The electronic component 210 is a semiconductor device with a six-terminal BGA package in which six terminals are provided with a pitch of 0.5 mm in a matrix of two rows by three columns. The electronic component 220 is a chip component of a size of 0.6 mm×0.3 mm. The electronic component 230 is a chip component of a size of 1.0 mm×0.5 mm. The electronic component 240 is a semiconductor device with a quad flat non-lead package (hereafter, referred to as QFN package). The QFN package is a package having lands at four sides.

Six oval lands 131 and 141 are provided on positions corresponding to the terminals of the electronic components 210 on the surface of the printed wiring board 130. The lands 131 corresponding to four terminals located at the corners are each shaped in an oval whose longer axis is in the horizontal direction in FIG. 4. The length in the shorter axis direction of the land 131 is 0.25 mm, and the length in the longer axis direction is 0.35 mm.

Circle openings in the insulating layer 133 are provided above the lands 131 and 141, and the diameter of the opening edge 133a of the opening is 0.35 mm.

Of the length of 0.35 mm in the longer axis direction, the middle part of 0.30 mm is opened to the electronic component 210, and the outer part of 0.05 mm is covered with the insulating layer 133 with respect to the electronic component 210. From each of the lands 131 located at the corners, a wiring 132 is drawn from a position including the opening edge 133a, which is the boundary between the covered region and the opened region in the top view, in a similar manner to FIG. 1A of the first embodiment.

The lands 141 corresponding to two terminals located in the sides except the corners, that is, in the second column are each shaped in an oval whose longer axis is in the vertical direction of FIG. 4. The length in the shorter axis direction of the land 141 is 0.25 mm, and the length in the longer axis direction is 0.45 mm. Of the length of 0.45 mm in the longer axis direction, the middle part of 0.30 mm is opened to the electronic component 210, and the outer part of 0.15 mm is covered with the insulating layer 133 with respect to the electronic component 210. From each of the lands 141, a wiring 142 is drawn from a portion covered with the insulating layer 133.

The printed wiring board 130 of the present embodiment is designed such that the electronic components 220, 230, and 240 can be densely mounted around the electronic component 210 with the BGA package for reduction in size, improvement of design flexibility, or the like due to reduced intervals of components. Therefore, with respect to the lands 131 located at the corners, the wirings 132 are each designed to be thinner than the land 131 and drawn from the lands 131. On the other hand, since there is a sufficient space for arrangement with respect to the lands 141 located in the sides, the wirings 142 are each designed to have a relatively wider width. In this configuration, the wirings 132 are more likely to be influenced by a stress occurring at the rise in the temperature.

Thus, in the present embodiment, the configuration in which the wirings 132 are drawn from positions each including the opening edge 133a as seen in the first embodiment is used for the lands 131 that are provided at the corners of the plurality of lands 131 and 141 provided in a matrix. Thereby, occurrence of a break can be reduced, and a printed wiring board and a printed circuit board with an improved reliability can be provided. In this regard, such a configuration may be employed that wirings are drawn from positions each including the opening edge for only some of the lands where each wiring is required to be thinner because of an insufficient space in the arrangement.

Fifth Embodiment

Figure 5:
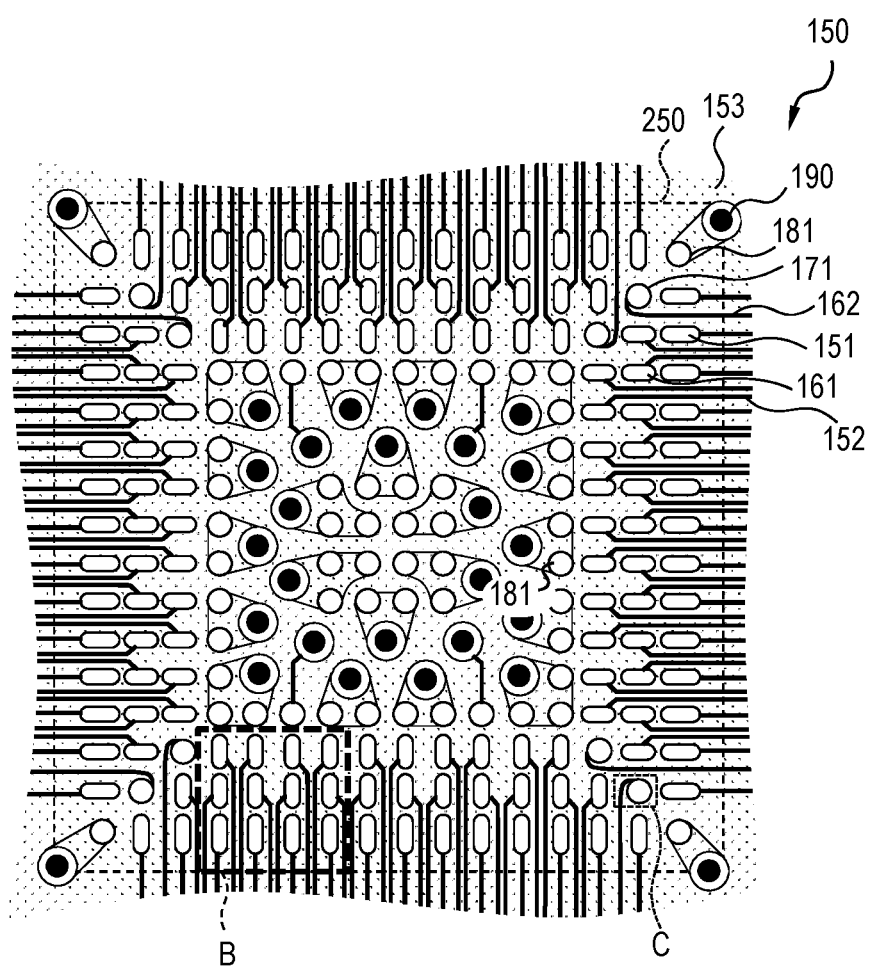
FIG. 5 is a plan view of a printed wiring board according to a fifth embodiment.

A printed wiring board and a printed circuit board according to the fifth embodiment of the present invention will be described with reference to FIG. 5, FIG. 6A and FIG. 6B. FIG. 5 is a plan view of a printed wiring board 150 according to the fifth embodiment. In the present embodiment, a more specific configuration of the printed wiring board 150 and the printed circuit board to which the present invention may be applied will be illustrated in a similar manner to the fourth embodiment.

The printed wiring board 150 according to the present embodiment is configured such that an electronic component 250 can be mounted thereon. A frame with a dashed line of FIG. 5 illustrates the external shape of the electronic component 250 that may be mounted. Further, via holes 190 each for electrically connecting a surface wiring to an inlayer wiring are provided in the printed wiring board 150. The electronic component 250 is a semiconductor device with a BGA package having 208 terminals at least a part of which are provided in a matrix.

In the printed wiring board 150, 208 lands 151, 161, 171, and 181 are provided at positions corresponding to the 208 terminals of the electronic component 250, respectively. The lands 151 are oval lands provided at positions of the outermost circumference of the land alignment except positions on the diagonal lines of the electronic component 250. The lands 161 are oval lands provided at positions of the second line and the third line inside from the outermost circumference of the land alignment except positions on the diagonal lines of the electronic component 250. Each of the lands 151 and 161 has a shorter axis in the direction along the closest external side of the electronic component 250 and has a longer axis in the direction orthogonal thereto.

The lands 171 are circle lands provided at positions on the diagonal lines of the electronic component 250 of the second line and the third line inside from the outermost circumference of the land alignment. Each of the lands 171 is shaped in a circle with a diameter of 0.375 mm. The lands 181 are located inside the third line from the outermost circumference and at the corners on the outermost circumference. Each of the lands 181 is shaped in a circle with a diameter of 0.35 mm. A wide wiring mainly for a power supply terminal or a ground terminal is connected to each land 181. This wiring is connected via the via hole 190 to a wiring on the backside of the printed wiring board 150.

Figure 6A:
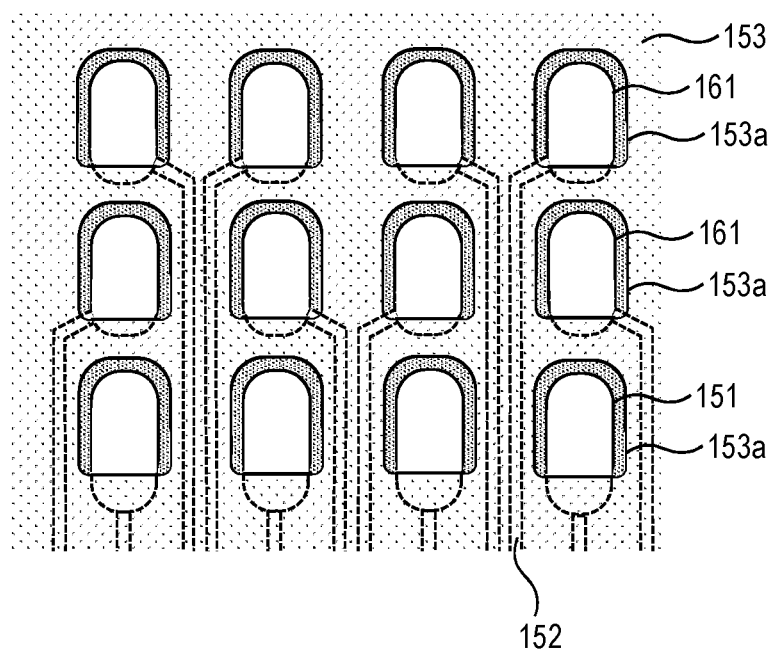
FIG. 6A and FIG. 6B are detailed diagrams of the printed wiring board according to the fifth embodiment.

FIG. 6A is a plan view illustrating details of the region depicted with the dashed line B of FIG. 5. FIG. 6A illustrates the lands 151 and 161, an insulating layer 153, and wirings 152. The insulating layer 153 has opening edges 153a at positions corresponding to respective lands 151 and 161. The length in the shorter axis direction of the opening edges 153a is 0.325 mm, and the length in the longer axis direction is 0.45 mm.

The length in the shorter axis direction of the land 161 is 0.225 mm, and the length in the longer axis direction is 0.55 mm. Of the length of 0.55 mm in the longer axis direction, the middle part of 0.40 mm is opened to the electronic component 250, and the outer part of 0.15 mm is covered with the insulating layer 153 with respect to the electronic component 250.

The length in the shorter axis direction of the land 151 is 0.225 mm, and the length in the longer axis direction is 0.45 mm. Of the length of 0.45 mm in the longer axis direction, the middle part of 0.40 mm is opened to the electronic component 250, and the outer part of 0.05 mm is covered with the insulating layer 153 with respect to the electronic component 250.

The width of the wiring 152 drawn from the land 161 is 0.075 mm, and the least width (the least gap) between the wirings is 0.075 mm. The wiring 152 is drawn from a position including the boundary between a covered region where the insulating layer 153 covers the land 161 and an opened region where the insulating layer 153 does not cover the land 161. The shape of the opening edge 153a is designed such that a part of the wiring 152 is exposed in the drawing direction of the wiring. Specifically, the curvature of the corner of the opening edge 153a is designed to be smaller in the outside than in the inside of the electronic component 250.

Figure 6B:
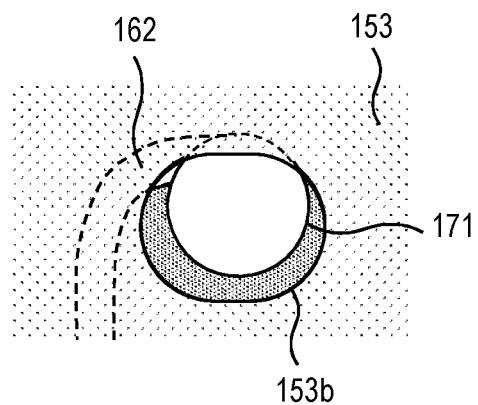

FIG. 6B is a plan view illustrating details of the region depicted with the dashed line C of FIG. 5. FIG. 6B illustrates the land 171, the insulating layer 153, and a wiring 162. The insulating layer 153 has an opening with an oval opening edge 153b at a position corresponding to the land 171. The length in the shorter axis direction of the opening edges 153b is 0.375 mm, and the length in the longer axis direction is 0.475 mm. Of the diameter of 0.375 mm of the land 171, the part of 0.325 mm is opened, and the remaining part of 0.05 mm is covered with the insulating layer 153. The wiring 162 is drawn from a position including the boundary between a covered region where the insulating layer 153 covers the land 171 and an opened region where the insulating layer 153 does not cover the land 171. Further, in a similar manner to the third embodiment, the wiring 162 is shaped so as to drawn from the land 171 and then separated from the land 171 in a spiral manner.

The minimum pitch of the terminals of the electronic component 250 mounted on the printed wiring board 150 according to the present embodiment is 0.65 mm. In order to allow the printed wiring board 150 to support such a narrow pitch, it is necessary to design to provide an upper limit to the length in the longer axis direction of the land 161 inside the outermost circumference and further draw the thin wiring 152 from the side of the land 161 as illustrated in FIG. 6A. In such a way, when the pitch of the terminals of the electronic component 250 is narrow, it is difficult to use a general design scheme for preventing a break of the wiring 152 such as design with an increased size of the land 161 and design with an increased width of the wiring 152. In contrast, in the present embodiment, the wiring 152 is configured to be drawn from a position including the boundary between the covered region where the insulating layer 153 covers the land 161 and the opened region where the insulating layer 153 does not cover the land 161. Thereby, for the same reasons as described in the first embodiment, the strength of a wiring drawn from a land against a stress is improved, and occurrence of a break can be reduced.

Further, when an electronic component, such as the electronic component 250, whose shape is a square or a rectangle close to a square is mounted on the printed wiring board 150, there is a problem that a stress is likely to concentrate at a terminal on the diagonal line thereof. In contrast, in the present embodiment, with respect to the land 171, which is provided at a position on the diagonal line of the electronic component 250, of the lands on the second and third lines inside from the outermost circumference of the land alignment, the wiring 162 is shaped so as to be separated from the land 171 in a spiral manner. Thereby, for the same reasons as described in the third embodiment, the strength of a wiring drawn from a land against a stress is improved, and occurrence of a break can be reduced.

Therefore, according to the present embodiment, even when the pitch of terminals of an electronic component to be mounted is narrow and the design of a wiring pattern is restricted, a printed wiring board and a printed circuit board with an improved reliability can be provided.

EXAMPLES

In order to more clearly show the advantages of the embodiment described above, results of a simulation and a reliability test carried out by the inventors will be described below.

Result of Stress Simulation

FIG. 7 is a graph illustrating a result of a stress applied to a wiring calculated by using a finite element method simulation when warping occurs in a printed wiring board due to heat generation of electronic components of the fourth embodiment. Further, FIG. 7 illustrates, as a comparison, a simulation result obtained when the structure of the wiring is changed to the structure of the comparative example. Here, the value of a stress illustrated in FIG. 7 is the maximum value of a Mises stress within a wiring.

It can be seen from FIG. 7 that, compared to the comparative example, a stress applied to the wiring decreases from 6.5 N/mm$^2$ to 5.3 N/mm$^2$ according to the configuration of the fourth embodiment. Therefore, a break of a wiring due to a stress is less likely to occur, and a printed wiring board and a printed circuit board with an improved reliability are provided.

Result of Heat Cycle Test

Figure 8:
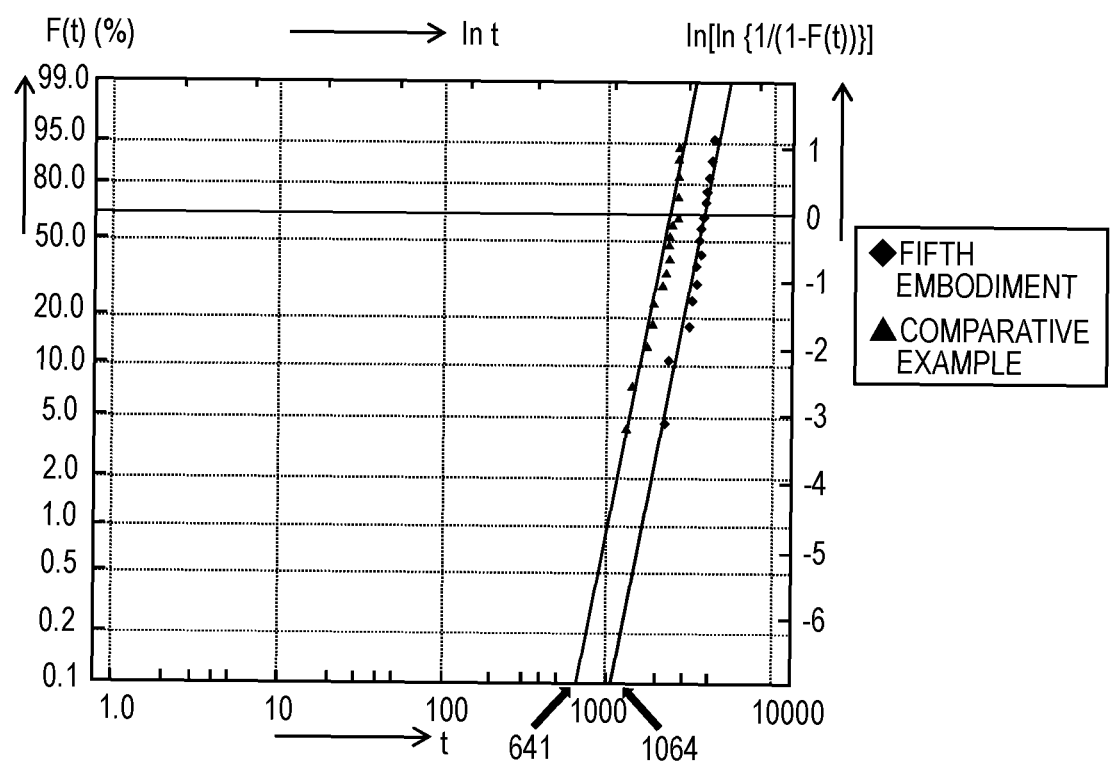
FIG. 8 is a Weibull probability graph resulted from a heat cycle test.

FIG. 8 illustrates a Weibull probability graph of a result of a heat cycle test obtained by making a printed circuit board of the fifth embodiment and a printed circuit board in which the structure of the wiring of the fifth embodiment is changed to the structure of the comparative example, respectively. The vertical axis of the graph represents a cumulative failure rate, and the horizontal axis represents the number of cycles by which a rise and a fall of the environment temperature are repeated.

When the life of the printed circuit board is defined as the number of cycles when the cumulative failure rate becomes 0.1%, while the life was 641 cycles in the printed circuit board of the first comparative example, the life was improved to 1064 cycles in the printed circuit board of the fifth embodiment. Further, inspection of the failure mode of these printed circuit boards indicated that the wiring was broken in the printed circuit board of the first comparative example while the junction of solder was broken in the printed circuit board of the fifth embodiment. The improvement of the life is therefore caused by the fact that the failure due to the break of the wiring was suppressed. Therefore, according to the configuration of the fifth embodiment, a break of a wiring due to a stress is less likely to occur, and a printed wiring board and a printed circuit board with an improved reliability are provided.

The embodiments described above are mere examples that exemplify some aspects to which the present invention may be applied, and do not prevent modifications and changes from being made as appropriate without departing from the spirit of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-170958, filed Sep. 1, 2016, which is hereby incorporated by reference herein in its entirety.

What is claimed is:

1. A printed wiring board comprising:
   a substrate;
   a conductive layer formed on the substrate, the conductive layer including a first land, a wiring drawn from the first land, and a second land formed at a position closer to an outer edge of the substrate than the first land, the wiring having a first edge formed along a drawing direction of the wiring and a second edge opposed to the first edge; and
   an insulating layer formed on the conductive layer, the insulating layer having an opening,
   wherein a distance between the first edge of the wiring and the second edge of the wiring is smaller than a width of the first land,
   wherein the first land includes a first region covered with the insulating layer and a second region not covered with the insulating layer, the first edge of the wiring being connected to the first region of the first land, the second edge of the wiring being connected to the second region of the first land,
   wherein an edge of the opening runs above the first land and above the second edge of the wiring and does not run above the first edge of the wiring, and
   wherein the wiring is drawn toward the outer edge of the substrate and extends to a position closer to the outer edge of the substrate than the second land.

2. The printed wiring board according to claim 1, wherein the opening is arranged so as to expose a part of a surface of the substrate.

3. The printed wiring board according to claim 2, wherein a part of an outer edge of the first land not covered with the insulating layer is longer than another part of the outer edge of the first land covered with the insulating layer.

4. The printed wiring board according to claim 1, wherein the distance between the first edge of the wiring and the second edge of the wiring is one third or less of the width of the first land.

5. The printed wiring board according to claim 1, wherein a shape of the first land is a circle or an ellipse in a top view from a direction perpendicular to a surface of the substrate.

6. The printed wiring board according to claim 1,
   wherein a boundary between the first land and the wiring and the edge of the opening have an intersecting point, and
   an angle of a normal direction of the edge of the opening running from the intersecting point toward the opening relative to a direction in which the wiring is drawn, is greater than or equal to 90 degrees.

7. A printed circuit board comprising:
   a substrate;
   a conductive layer formed on the substrate, the conductive layer including a first land, a wiring drawn from the first land, and a second land formed at a position closer to an outer edge of the substrate than the first land, the wiring having a first edge formed along a drawing direction of the wiring and a second edge opposed to the first edge;
   an insulating layer formed on the conductive layer, the insulating layer having an opening; and
   an electronic component joined to a part of the first land by solder,
   wherein a distance between the first edge of the wiring and the second edge of the wiring is smaller than a width of the first land,
   wherein the first land includes a first region covered with the insulating layer and a second region not covered with the insulating layer, the first edge of the wiring being connected to the first region of the first land, the second edge of the wiring being connected to the second region of the first land,
   wherein an edge of the opening runs above the first land and above the second edge of the wiring and does not run above the first edge of the wiring,
   wherein the solder is in contact with the second region of the first land and the second edge of the wiring and the solder is not in contact with the first region of the first land and the first edge of the wiring, and
   wherein the wiring is drawn toward the outer edge of the substrate and extends to a position closer to the outer edge of the substrate than the second land.

8. The printed circuit board according to claim 7, wherein the opening is arranged so as to expose a part of a surface of the substrate.

9. The printed circuit board according to claim 8, wherein a part of an outer edge of the first land covered with the insulating layer is longer than another part of the outer edge of the first land not covered with the insulating layer.

10. The printed circuit board according to claim 7, wherein the distance between the first edge of the wiring and the second edge of the wiring is one third or less of the width of the first land.

11. The printed circuit board according to claim 7, wherein a shape of the first land is a circle or an ellipse in a top view from a direction perpendicular to a surface of the substrate.

12. The printed circuit board according to claim 7,
    wherein a boundary between the first land and the wiring and the edge of the opening have an intersecting point, and
    an angle of a normal direction of the edge of the opening running from the intersecting point toward the opening relative to a direction in which the wiring is drawn, is greater than or equal to 90 degrees.

13. The printed circuit board according to claim 7 comprising a plurality of the first lands and a plurality of the second lands,
    wherein the plurality of first lands and the plurality of second lands are provided in a matrix, and
    wherein the plurality of second lands are provided at an outermost circumference of the matrix.

14. An electronic device comprising:
    a printed circuit board built in the electronic device,
    wherein the printed circuit board includes:
      a substrate;
      a conductive layer formed on the substrate, the conductive layer including a first land, a wiring drawn from the first land, and a second land formed at a position closer to an outer edge of the substrate than the first land, the wiring having a first edge formed along a drawing direction of the wiring and a second edge opposed to the first edge;
      an insulating layer formed on the conductive layer, the insulating layer having an opening; and
      an electronic component joined to a part of the first land by solder,
    wherein a distance between the first edge of the wiring and the second edge of the wiring is smaller than a width of the first land, wherein the first land includes a first region covered with the insulating layer and a second region not covered with the insulating layer, the first edge of the wiring being connected to the first region of the first land, the second edge of the wiring being connected to the second region of the first land, wherein an edge of the opening runs above the first land and above the second edge of the wiring and does not run above the first edge of the wiring, wherein the solder is in contact with the second region of the first land and the second edge of the wiring and the solder is not in contact with the first region of the first land and the first edge of the wiring, and wherein the wiring is drawn toward the outer edge of the substrate and extends to a position closer to the outer edge of the substrate than the second land.

15. The electronic device according to claim 14, wherein the opening is arranged so as to expose a part of a surface of the substrate.

16. The electronic device according to claim 15, wherein a part of an outer edge of the first land covered with the insulating layer is longer than another part of the outer edge of the first land not covered with the insulating layer.

17. The electronic device according to claim 14, wherein the distance between the first edge of the wiring and the second edge of the wiring is one third or less of the width of the first land.

18. The electronic device according to claim 14, wherein a shape of the first land is a circle or an ellipse in a top view from a direction perpendicular to a surface of the substrate.

19. The electronic device according to claim 14, wherein a boundary between the first land and the wiring and the edge of the opening have an intersecting point, and an angle of a normal direction of the edge of the opening running from the intersecting point toward the opening relative to a direction in which the wiring is drawn, is greater than or equal to 90 degrees.

20. The electronic device according to claim 14, wherein the printed circuit board includes a plurality of the first lands and a plurality of the second lands, wherein the plurality of first lands and the plurality of second lands are provided in a matrix, and wherein the plurality of second lands are provided at an outermost circumference of the matrix.

\* \* \* \* \*